(12) United States Patent
Park et al.

(10) Patent No.: US 12,038,718 B2
(45) Date of Patent: Jul. 16, 2024

(54) HOLOGRAPHIC MICROSCOPE AND MANUFACTURING METHOD OF SEMICONDUCTOR DEVICE USING THE SAME

(71) Applicant: SAMSUNG ELECTRONICS CO., LTD., Suwon-si (KR)

(72) Inventors: Seungbeom Park, Gwangju (KR); Sungmin Park, Seoul (KR); Jaehyeon Son, Hwaseong-si (KR); Heejun Ahn, Seoul (KR); Myungjun Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 959 days.

(21) Appl. No.: 17/060,526

(22) Filed: Oct. 1, 2020

(65) Prior Publication Data
US 2021/0200148 A1 Jul. 1, 2021

(30) Foreign Application Priority Data
Dec. 31, 2019 (KR) ........................ 10-2019-0179800

(51) Int. Cl.
*G03H 1/00* (2006.01)
*G01N 21/95* (2006.01)
(Continued)

(52) U.S. Cl.
CPC ....... *G03H 1/0005* (2013.01); *G01N 21/9501* (2013.01); *G01N 21/9503* (2013.01);
(Continued)

(58) Field of Classification Search
CPC ...... G03H 1/0005; G03H 1/0443; G03H 1/16; G03H 2001/005; G03H 2001/045;
(Continued)

(56) References Cited

U.S. PATENT DOCUMENTS 8,665,504 B2 3/2014 Awatsuji et al.
9,417,608 B2 8/2016 Yu
(Continued)

FOREIGN PATENT DOCUMENTS

JP 2009192520 A 8/2009
JP 4974543 B2 7/2012
(Continued)

OTHER PUBLICATIONS

Takao, Minute displacement and strain analysis using lensless Fourier transformed holographic interferometry, Jul. 2001, Optics and Lasers in Engineering 38.5: pp. 233-244. (Year: 2002).*

*Primary Examiner* — Michael A Lyons
*Assistant Examiner* — Omar H Nixon
(74) *Attorney, Agent, or Firm* — Sughrue Mion, PLLC

(57) ABSTRACT

Provided is a holographic microscope including an input optical system configured to emit polarized input beam, a first beam splitter configured to emit an object beam by reflecting a portion of the polarized input beam, and emit a reference beam by transmitting a remaining portion of the polarized input beam, a reference optical system configured (Continued)

to separate the reference beam into a first reference beam and a second reference beam, a camera configured to receive the first reference beam and the second reference beam and the object beam that is reflected by an inspection object, the camera including a micro polarizer array, wherein a first polarization axis of the first reference beam is perpendicular to a second polarization axis of the second reference beam.

20 Claims, 20 Drawing Sheets

(51) Int. Cl.
G02B 21/00 (2006.01)
G03H 1/04 (2006.01)
G03H 1/16 (2006.01)
H01L 21/66 (2006.01)

(52) U.S. Cl.
CPC ....... *G02B 21/0016* (2013.01); *G03H 1/0443* (2013.01); *G03H 1/16* (2013.01); *H01L 22/12* (2013.01); *G03H 2001/005* (2013.01); *G03H 2001/045* (2013.01); *G03H 2001/0452* (2013.01)

(58) Field of Classification Search
CPC ....... G03H 2001/0452; G01N 21/9501; G01N 21/9503; G02B 21/0016; H01L 22/12
USPC ........................................ 356/457
See application file for complete search history.

(56) References Cited

U.S. PATENT DOCUMENTS

| 9,816,801 | B2 | 11/2017 | Girshovitz et al. |
| 10,367,020 | B2 | 7/2019 | Cheng et al. |
| 2013/0100456 | A1* | 4/2013 | Yu ..................... G01B 9/02014 356/479 |
| 2015/0205260 | A1 | 7/2015 | Awatsuji et al. |
| 2019/0121292 | A1 | 4/2019 | Kim et al. |
| 2019/0369557 | A1 | 12/2019 | Lee et al. |
| 2020/0064276 | A1 | 2/2020 | Lee et al. |

FOREIGN PATENT DOCUMENTS

| KR | 1020170079441 A | 7/2017 |
| KR | 101789441 B1 | 10/2017 |
| KR | 101987402 B1 | 6/2019 |
| KR | 1020190138200 A | 12/2019 |
| KR | 102020002222 A | 3/2020 |

* cited by examiner

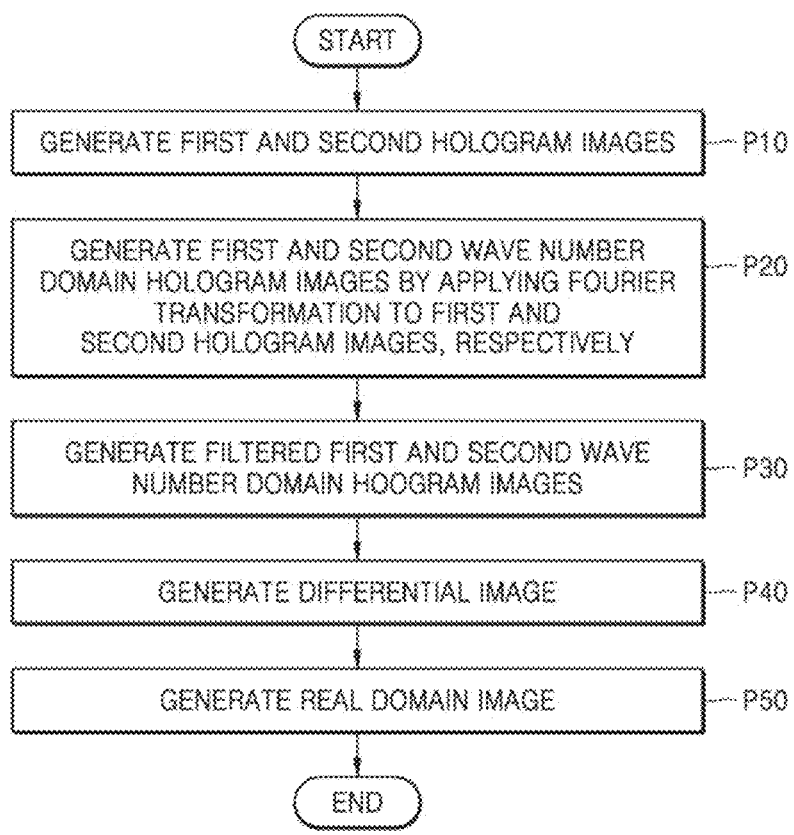

HOLOGRAPHIC MICROSCOPE AND MANUFACTURING METHOD OF SEMICONDUCTOR DEVICE USING THE SAME

CROSS-REFERENCE TO RELATED APPLICATION

This application claims priority to Korean Patent Application No. 10-2019-0179800, filed on Dec. 31, 2019 in the Korean Intellectual Property Office, the disclosure of which is incorporated herein in its entirety by reference.

BACKGROUND

Example embodiments of the present disclosure relate to a holographic microscope and a manufacturing method of a semiconductor device using the same.

A hologram is an imaging method designed to create a three-dimensional (3D) object-like image. To generate the hologram, light from a coherent input optical system may be split into two light beams. One light beam of the divided light directly reaches a light-receiving element, and the other light beam is reflected by an object from which an image is to be obtained and then reaches a light-receiving element. Here, the light that directly reaches the light-receiving element may be a reference beam, and the light that reaches the light-receiving element after having been reflected by the object may be an object beam. An image generated by interference between the reference beam and the object beam may be a hologram, and because the object beam is light reflected by a surface of the object, the object beam has a phase dependent on the surface of the object. Accordingly, a hologram image may store light phase information as well as light intensity information.

SUMMARY

Example embodiments provide a holographic microscope having an enhanced reliability and a manufacturing method of a semiconductor device using the same.

The issues to be solved by the technical idea of the present disclosure are not limited to the above-mentioned issues, and other issues not mentioned may be clearly understood by those of ordinary skill in the art from the following description.

According to an aspect of an example embodiment, there is provided a holographic microscope including an input optical system configured to emit a polarized input beam, a first beam splitter configured to emit an object beam by reflecting a portion of the polarized input beam, and emit a reference beam by transmitting a remaining portion of the polarized input beam, a reference optical system configured to separate the reference beam into a first reference beam and a second reference beam; a camera configured to receive the first reference beam, the second reference beam, and the object beam that is reflected by an inspection object and, a micro polarizer array adjacent to the camera, wherein each of the first reference beam, the second reference beam and the object beam passes through the micro polarizer array before being received by the camera, and wherein a first polarization direction of the first reference beam is perpendicular to a second polarization direction of the second reference beam.

According to an aspect of an example embodiment, there is provided holographic microscope including an input optical system configured to emit an input beam, a beam splitter configured to emit an object beam by reflecting a portion of the input beam, and emit a reference beam by transmitting a remaining portion of the input beam, a reference optical system configured to receive the reference beam and separate the reference beam into a first reference beam and a second reference beam, a camera configured to generate a first hologram image and a second hologram image based on the object beam, the first reference beam, and the second reference beam, a micro polarizer array adjacent to the camera; and a processor configured to process the first hologram image and the second hologram image, wherein each of the first reference beam, the second reference beam and the object beam passes through the micro polarizer array before being received by the camera, and wherein the first reference beam and the second reference beam are obliquely incident on the camera, and the object beam is perpendicularly incident on the camera.

According to an aspect of an example embodiment, there is provided a holographic microscope including an input optical system configured to emit an input beam, a beam splitter configured to emit an object beam by reflecting a portion of the input beam, and emit a reference beam by transmitting a remaining portion of the input beam, a reference optical system configured to separate the reference beam into a first reference beam and a second reference beam, and a camera configured to receive the first reference beam, the second reference beam, and the object beam that is reflected by a wafer, and a micro polarizer array adjacent to the camera, wherein each of the first reference beam, the second reference beam and the object beam passes through the micro polarizer array before being received by the camera, and wherein a first incident angle of the first reference beam on the camera is different from a second incident angle of the object beam on the camera.

According to an aspect of an example embodiment, there is provided a holographic microscope including an input optical system configured to emit an input beam, a beam splitter configured to emit an object beam by reflecting a portion of the input beam, and emit a reference beam by transmitting a remaining portion of the input beam, a reference optical system configured to separate the reference beam into a first reference beam and a second reference beam, a camera configured to generate a first hologram image and a second hologram image based on the first reference beam, the second reference beam, and the object beam that is reflected by a wafer, and a micro polarizer array adjacent to the camera, wherein each of the first reference beam, the second reference beam and the object beam passes through the micro polarizer array before being received by the camera, and wherein the first hologram image is generated based on interference between the first reference beam and the object beam, and the second hologram image is generated based on interference between the second reference beam and the object beam.

According to an aspect of an example embodiment, there is provided a holographic microscope including an input optical system configured to emit a polarized input beam, a beam splitter configured to emit an object beam by reflecting a portion of the polarized input beam, and emit a reference beam by transmitting a remaining portion of the polarized input beam, a reference optical system configured to separate the reference beam into a first reference beam and a second reference beam, a camera configured to receive the first reference beam, the second reference beam, and the object beam that is reflected by an inspection object, and a micro polarizer array adjacent to the camera, wherein each of the first reference beam, the second reference beam and the object beam passes through the micro polarizer array before being received by the camera, and the camera including a micro polarizer array, wherein a first polarization direction of the first reference beam is different from a second polarization direction of the second reference beam.

According to an aspect of an example embodiment, there is provided a manufacturing method of a semiconductor device, the manufacturing method including generating a first hologram image by interfering a first reference beam that is linearly polarized with an object beam that is reflected by a top surface of a wafer, and generating a second hologram image by interfering a second reference beam having a polarization direction perpendicular to the first reference beam with the object beam, generating the first hologram image in a wave number domain and the second hologram image in the wave number domain by applying Fourier transform to a first image and a second image, respectively, and generating a differential image in the wave number domain based on the first hologram image in the wave number domain and the second hologram image in the wave number domain, wherein the first hologram image and the second hologram image are generated by a camera, and wherein the first reference beam and the second reference beam are obliquely incident on the camera, and the object beam is perpendicularly incident on the camera.

According to an aspect of an example embodiment, there is provided a manufacturing method of a semiconductor device, the manufacturing method including coating a photoresist layer on a wafer, removing a portion of the photoresist layer coated on a boundary of the wafer based on an edge bead removal operation, and evaluating the edge bead removal operation, wherein the evaluating of the edge bead removal operation includes generating a first hologram image by interfering a first reference beam that is linearly polarized with an object beam that is reflected by an edge portion of the wafer, and generating a second hologram image by interfering a second reference beam having a polarization direction perpendicular to the first reference beam with the object beam, generating the first hologram image in a wave number domain and the second hologram image in the wave number domain by applying Fourier transform to a first image and a second image, respectively, and generating a differential image in the wave number domain based on the first hologram image in the wave number domain and the second hologram image in the wave number domain, wherein the first hologram image and the second hologram image are generated by a camera, and wherein the first reference beam and the second reference beam are inclined at different angles from each other with respect to the camera, and the object beam is perpendicularly incident on the camera.

According to an aspect of an example embodiment, there is provided a manufacturing method of a semiconductor device, the manufacturing method including coating a photoresist layer on a wafer, removing a portion of the photoresist layer coated on a boundary of the wafer based on an edge bead removal operation, evaluating the edge bead removal operation, and performing laser cleaning on the photoresist layer based on the evaluation of edge bead removal operation, wherein the evaluating the edge bead removal operation comprises: generating a first hologram image by interfering a first reference beam that is linearly polarized with an object beam that is reflected by an edge portion of the wafer, and generating a second hologram image by interfering a second reference beam having a polarization direction perpendicular to the first reference beam with the object beam; generating the first hologram image in a wave number domain and the second hologram image in the wave number domain by applying Fourier transform to a first image and a second image, respectively; and generating a differential image in the wave number domain based on the first hologram image in the wave number domain and the second hologram image in the wave number domain, wherein the first hologram image and the second hologram image are generated by a camera, and wherein a first polarization direction of the first reference beam is substantially perpendicular to a second polarization direction of the second reference beam.

BRIEF DESCRIPTION OF THE DRAWINGS

The above and/or other aspects of example embodiments will be more clearly understood from the following detailed description, taken in conjunction with the accompanying drawings, in which:

FIG. 3 is a flowchart describing an inspection method using a holographic microscope, according to an example embodiment;

DETAILED DESCRIPTION

Figure 1:
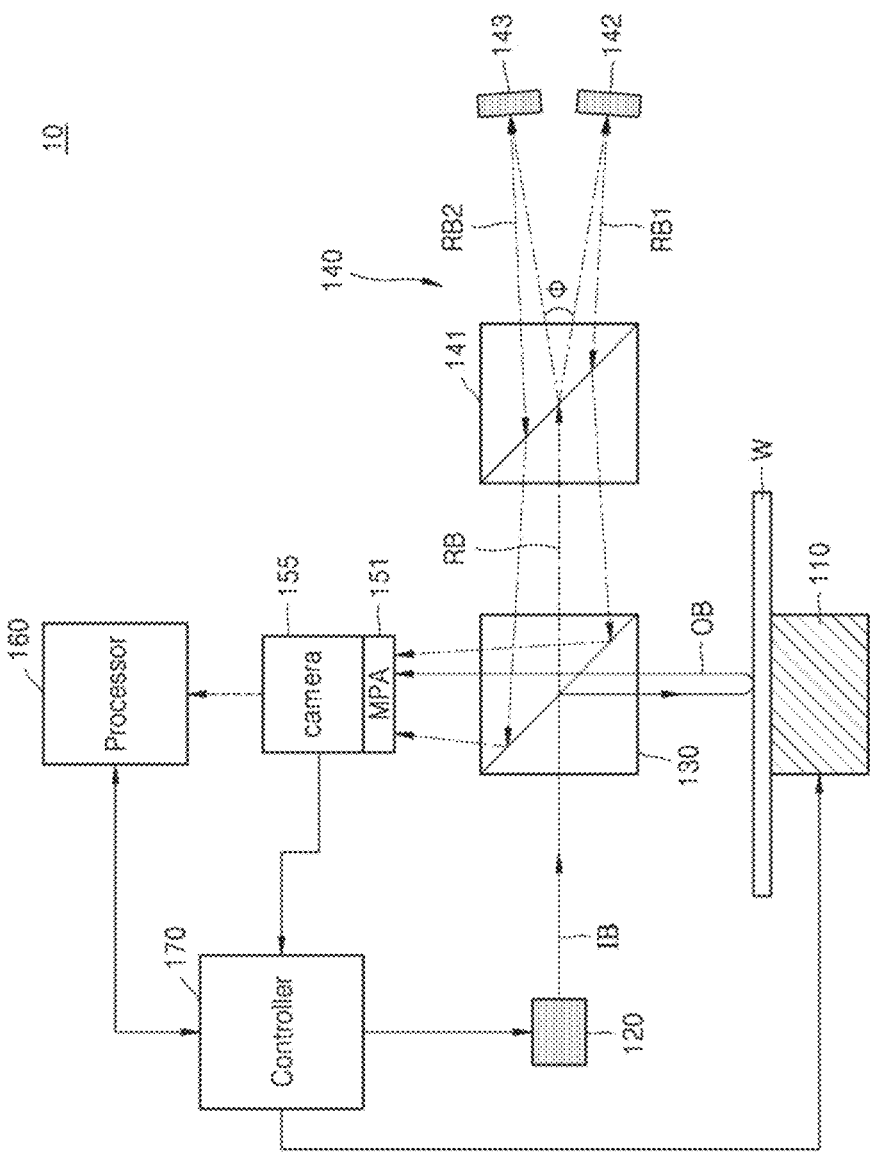
FIG. 1 illustrates a holographic microscope according to an example embodiment.

Hereinafter, example embodiments will be described in detail with reference to the accompanying drawings. Identical reference numerals are used for the same constituent devices in the drawings, and a duplicate description thereof will be omitted.

FIG. 1 is a schematic diagram of a holographic microscope 10 according to an example embodiment.

Referring to FIG. 1, the holographic microscope 10 may include a stage 110, an input optical system 120, a beam splitter 130, a reference optical system 140, a micro polarizer array (MPA) 151, a camera 155, a processor 160, and a controller 170.

Because the holographic microscope 10 may simultaneously provide sub-micron resolution and a very large field of view, the holographic microscope 10 may have an advantage of shortening a turnaround time (TAT). The holographic microscope 10 may be a computational diffraction microscopy (CDM) system. The holographic microscope 10 may generate a plurality of hologram images, generate hologram images in a plurality of wave number domains by applying Fourier transform on the generated plurality of hologram images, generate differential images having DC noise removed therefrom by performing computations between the generated hologram images in the plurality of wave number domains, and generate real domain images of an enhanced signal to noise ratio (SNR) by applying inverse Fourier transform on the generated differential images.

The stage 110 may be a device for fixing and supporting a wafer W. The stage 110 may include chucks, such as vacuum chucks and electrostatic chucks. The stage 110 may move the wafer W horizontally. Moving the wafer W horizontally may be moving the wafer W in a direction perpendicular to a normal to a top surface of the wafer W. The stage 110 may rotate the wafer W with the normal passing through the center of the wafer W, as a rotational axis.

The wafer W may include, for example, silicon (Si). The wafer W may include a semiconductor element such as germanium (Ge), or a compound semiconductor such as silicon carbide (SiC), gallium arsenide (GaAs), and indium arsenide (InAs). According to example embodiments, the wafer W may have a silicon on insulator (SOI) structure. The wafer W may include a buried oxide layer. According to example embodiments, the wafer W may include a conductive region, for example, a well doped with impurities. In example embodiments, the wafers W may have various device isolation structures such as a shallow trench isolation (STI) that separates the doped wells apart from each other. Multiple material layers may be formed on the wafer W, and a photoresist may be additionally provided on the multiple material layers.

The wafer W may be prepared for manufacturing either a memory element or a non-memory element. According to example embodiments, the memory device may include a non-volatile NAND-type flash memory. According to example embodiments, the memory device may include parameter random-access memory (PRAM), magnetoresistive RAM (MRAM), resistive RAM (ReRAM), ferroelectric RAM (FRAM), a NOR flash memory, and the like. In addition, the memory device may include a volatile memory device in which data is lost when power is cut off, such as dynamic RAM (DRAM) and static RAM (SRAM). According to example embodiments, the memory device may include a logic chip or a measurement device, a communication device, a digital signal processor (DSP), or a system-on-chip (SOC).

The input optical system 120 may emit input light beam IB for optically and non-destructively inspecting the wafer W. According to example embodiments, the input optical system 120 may include a system including a plurality of optical elements such as a collimator, a polarizer, and a condenser lens, but embodiments are not limited thereto. For example, the input optical system 120 may include a single light source, but embodiments are not limited thereto.

According to example embodiments, the input optical system 120 may include a mono-chromatic point source. The input optical system 120 may emit light beam in a discontinuous spectrum, such as a sodium lamp or a mercury lamp. According to example embodiments, the input optical system 120 may include a laser which generates and outputs laser beam. According to example embodiments, the input optical system 120 may include any one of a gas laser such as a helium-neon (He—Ne) laser and a carbon dioxide ($CO_2$) laser, a solid-state laser such as a ruby crystal laser and a yttrium aluminum garnet (YAG) laser, and a semiconductor laser such as a GaAs laser and an indium phosphide (InP) laser.

According to example embodiments, the input light beam IB may be coherent and collimated light beam. The input light beam IB may be a linearly polarized light beam. According to example embodiments, the input light beam IB may be polarized to include both a S-polarized component and a P-polarized component. According to example embodiments, a polarization axis of the input light beam IB may be polarized at about 45° to an incident plane, but embodiments are not limited thereto. For example, the input light beam IB may be polarized at any angle, and may also be either the P-polarized light beam or a S-polarized light beam.

According to example embodiments, a magnitude of a component parallel with a polarization direction of a first reference beam RB1 of the input beams IB may be substantially the same as a magnitude of a component parallel with the polarization direction of a second reference beam RB2. According to example embodiments, a magnitude of a component parallel with the P-polarization of the input beam IB may be substantially the same as a magnitude of a component parallel with the S-polarization.

The beam splitter 130 may divide the input beam IB into an object beam OB and a reference beam RB. As a non-limiting example, a beam reflected by the beam splitter 130 may become the object beam OB, and a beam passing through the beam splitter 130 may become the reference beam RB.

After being reflected from the wafer W provided on the stage 110, the object beam OB may pass through the beam splitter 130 and the MPA 151, and may enter the camera 155.

The reference optical system 140 may receive the reference beam RB and generate the first reference beam RB1 and the second reference beam RB2. As a non-limiting example, the reference optical system 140 may include, for example, a polarization prism 141 such as the Wollaston prism, and the first mirror 142 and the second mirror 143.

The first reference beam RB1 and the second reference beam RB2 may be beams separated by polarization by the polarization prism 141, and may include different polarization components from each other. According to example embodiments, a polarization axis of the first reference beam RB1 and a polarization axis of the second reference beam RB2 may be perpendicular to each other. For example, the first reference beam RB1 may include only the P-polarization component, and the second reference beam RB2 may include only the S-polarization component, but embodiments are not limited thereto. The first reference beam RB1 and the second reference beam RB2 may be polarized at arbitrary angles orthogonal to each other. The angle between traveling directions of the first reference beam RB1 and the second reference beam RB2 may be Φ.

The first reference beam RB1 and the second reference beam RB2 may be reflected by the first mirror 142 and the second mirror 143, respectively, and after passing through the reference optical system 140, the first reference beam RB1 and the second reference beam RB2 may be reflected by the beam splitter 130. The first reference beam RB1 and the second reference beam RB2 may pass through the MPA 151 and enter the camera 155.

Here, a structure of the MPA 151 is described with reference to FIG. 2.

Figure 2:
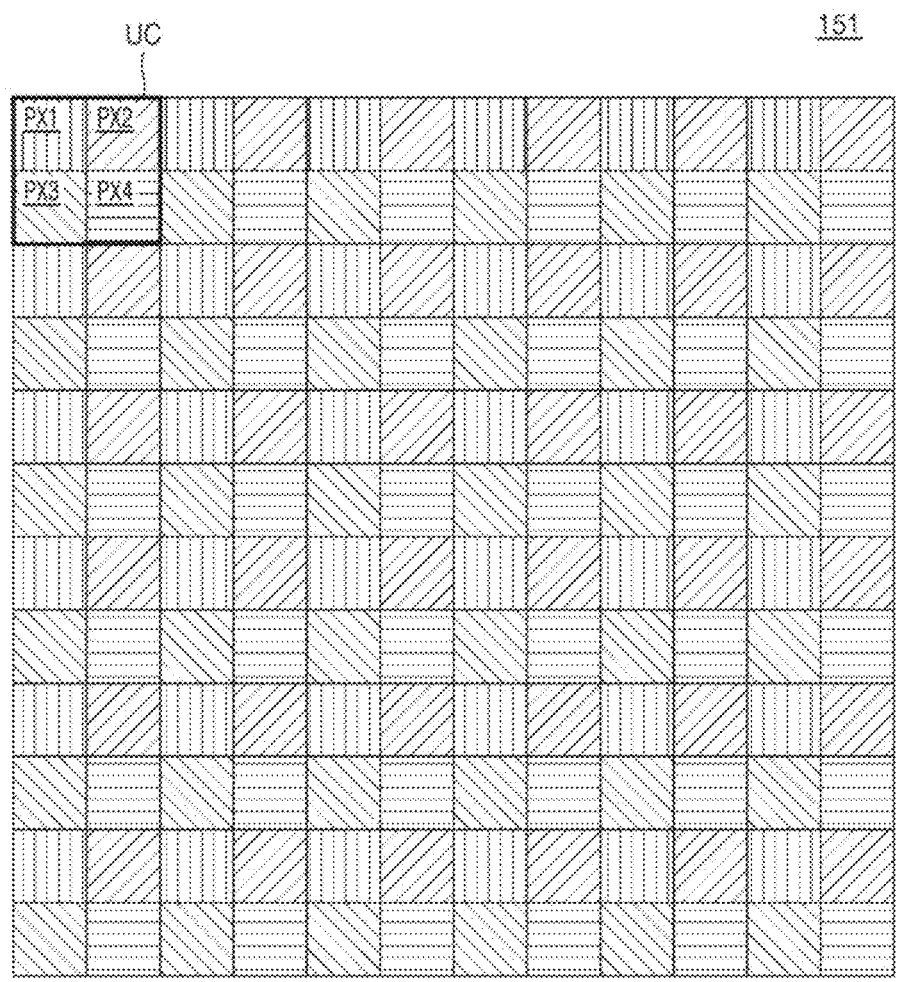
FIG. 2 illustrates a micro polarizer array (MPA) according to an example embodiment.

FIG. 2 is a diagram for describing the MPA 151 according to example embodiments.

Referring to FIG. 2, the MPA 151 may include a plurality of unit cells UC. According to example embodiments, each of the plurality of unit cells UC may include a first pixel PX1, a second pixel PX2, a third pixel PX3, and a fourth pixel PX4 arranged in a matrix of 2 by 2. Each of the first pixel PX1, the second pixel PX2, the third pixel PX3, and the fourth pixel PX4 may correspond to one of different pixels of the camera 155. For example, a beam that has passed through one of the pixels of the MPA 151 may enter one of the different pixels of the camera 155.

The first pixel PX1, the second pixel PX2, the third pixel PX3, and the fourth pixel PX4 may have different polarization axes from each other. For example, an angle of a polarization axis in a direction through which only P-polarization beam passes, such as the first pixels PX1, may be defined as a reference angle of about 0°. As a non-limiting example, the polarization axis of the second pixels PX2 may be about 45°, the polarization axis of the third pixels PX3 may be about 135°, and the polarization axis of the fourth pixels PX4 may be about 90°.

Referring to FIGS. 1 and 2, the camera 155 may generate a plurality of hologram images by receiving the object beam OB and the first reference beam RB1 and the second reference beam RB2. The camera 155 may include, for example, a charge coupled device (CCD) camera, or a complementary metal oxide semiconductor (CMOS) image sensor (CIS) camera. The camera 155 may generate a first hologram image corresponding to the first pixels PX1, a second hologram image corresponding to the fourth pixels PX4, and a third hologram image corresponding to the second pixels PX2. The first through third hologram images may be generated substantially and simultaneously from the same portion of the wafer W.

For example, the first hologram image may be generated by signals of the pixels of the camera 155 corresponding to the first pixels PX1, the second hologram image may be generated by signals of the pixels of the camera 155 corresponding to the second pixels PX2, and the third hologram image may be generated by signals of the pixels of the camera 155 corresponding to the third pixels PX3.

According to example embodiments, the first hologram image may be generated by interference between the object beam OB and the first reference beam RB1, and the second hologram image may be generated by interference between the object beam OB and the second reference beam RB2. According to example embodiments, the third hologram image may be generated by interference between the object beam OB and the first reference beam RB1 and the second reference beam RB2.

The processor 160 may generate a differential image of at least some of the first through third hologram images. According to example embodiments, the processor 160 may perform the Fourier transform on the first and second hologram images and generate the first and second hologram images in the wave number domain. According to example embodiments, the processor 160 may generate a differential image of the first and second holographic images in the wave number domain. The processor 160 may perform a parallel movement of any one of pass bands of the differential image such that a local maximum point included in the pass band is located at the origin.

According to example embodiments, the processor 160 may generate a real domain image from which the DC component has been removed, by inversely transforming the wave number domain differential image. According to example embodiments, the processor 160 may generate a real domain image from which the DC component has been removed, by generating a differential image of the wave number domain hologram images by reference beams in different polarization states from each other.

The controller 170 may generate a signal for controlling the overall operation of active elements of the holographic microscope 10. The controller 170 may control parallel movement and rotation of the stage 110. The controller 170 may control generation of the input beam IB and optical properties thereof, for example, a wavelength and a polarization direction, of the input optical system 120. The controller 170 may control generation of the first through third hologram images by the camera 155. The controller 170 may control processing of the first through third hologram images by the processor 160.

According to example embodiments, the processor 160 and the controller 170 may include a computing device such as a workstation computer, a desktop computer, a laptop computer, a tablet computer, etc. The processor 160 and the controller 170 may include a simple controller, a complex processor such as a microprocessor, a central processing unit (CPU), and a graphics processing unit (GPU), a processor configured by software, dedicated hardware or firmware. The processor 160 and the controller 170 may be implemented by application specific hardware, for example, a general purpose computer or such as a digital signal processor (DSP), a field programmable gate array (FPGA), an application specific integrated circuit (ASIC), and the like.

According to example embodiments, operations of the processor 160 and the controller 170 may be implemented as instructions stored on a machine readable medium that may be read and executed by one or more processors. In this case, the machine-readable medium may include any mechanism for storing and/or transmitting information in a form readable by a machine, for example, a computing device. For example, the machine-readable medium may include read-only memory (ROM), random access memory (RAM), a magnetic disk storage media, an optical storage media, flash memory devices, electrical, optical, acoustical or other forms of propagated signals (for example, carrier waves, infrared signals, and digital signals), and any other signals.

The processor 160 and the controller 170 may be configured with firmware, software, routines, and instructions for performing the described-above operation. For example, the processor 160 and the controller 170 may generate the first through third hologram images that are different from each other, generate the differential image by applying the Fourier transform on the first through third hologram images, and may be implemented by software configured to perform computations to generate a size image and a phase image through phase fetching.

However, this is only an example, and it should be understood that the operations of the processor 160 and the controller 170 described above may be implemented by a computing device, a processor, a controller, or other device that executes firmware, software, routines, instructions, and the like.

According to example embodiments, the holographic microscope 10 may inspect structures, defects, and the like formed on the wafer W. According to example embodiments, the holographic microscope 10 may inspect defects such as particle defects and scratches, shapes of photoresist on bevel/edge regions, line widths and pitches of patterns, line end roughness (LER), and the like. According to example embodiments, the holographic microscope 10 may generate images for generating a model function and an overlay function.

For example, the holographic microscope 10 may perform after develop inspection (ADI). For example, the holographic microscope 10 may perform a post etching inspection. For example, the holographic microscope 10 may inspect the wafer after performing the cleaning process following the etching process.

FIG. 3 is a flowchart describing an inspection method using a holographic microscope 10 in FIG. 1 according to example embodiments.

FIGS. 4A through 5D illustrate an inspection method using a holographic microscope 10 in FIG. 1 according to example embodiments.

Figure 4A:
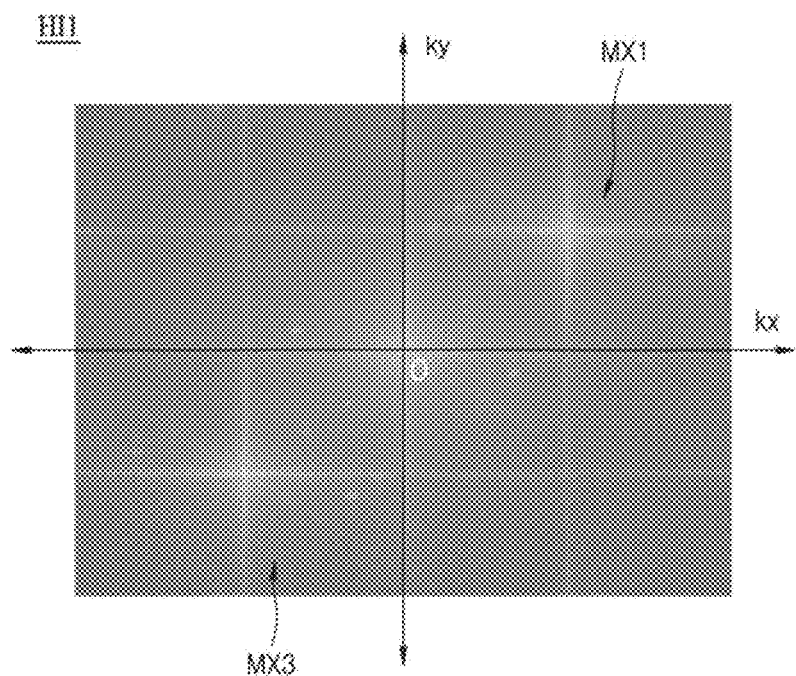
FIGS. 4A, 4B, 4C, 5A, 5B, 5C, and 5D are illustrate an inspection method using a holographic microscope, according to an example embodiment.
Figure 4B:
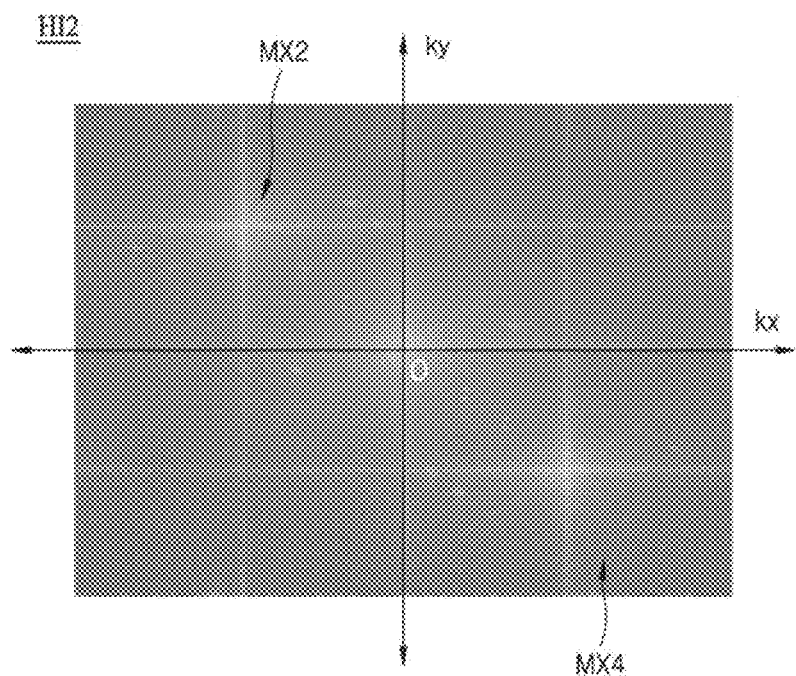
Figure 4C:
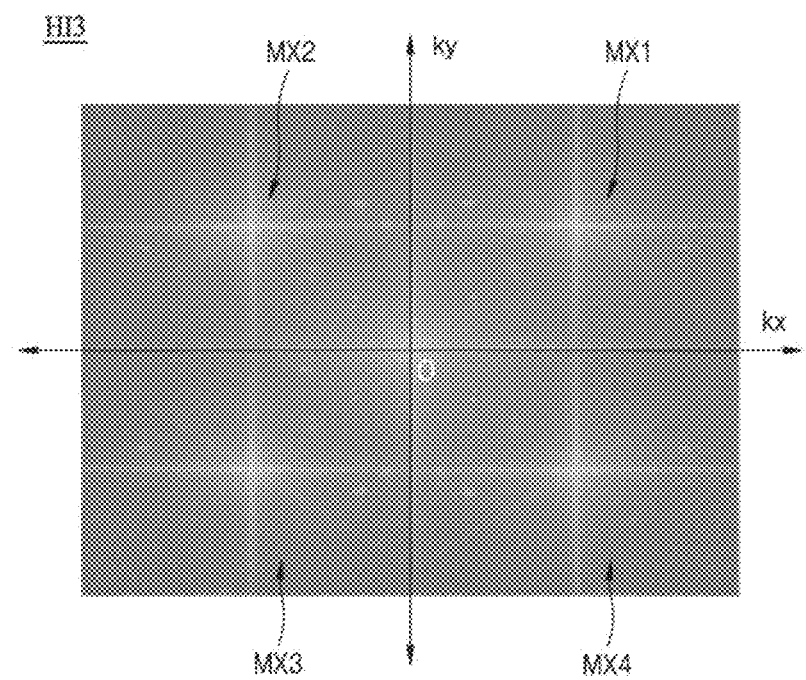
Figure 5A:
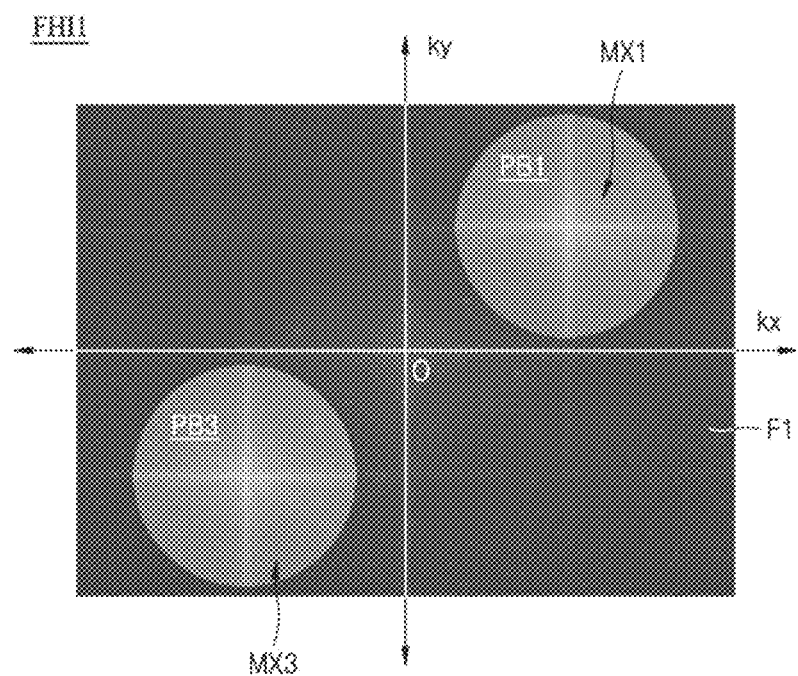
Figure 5B:
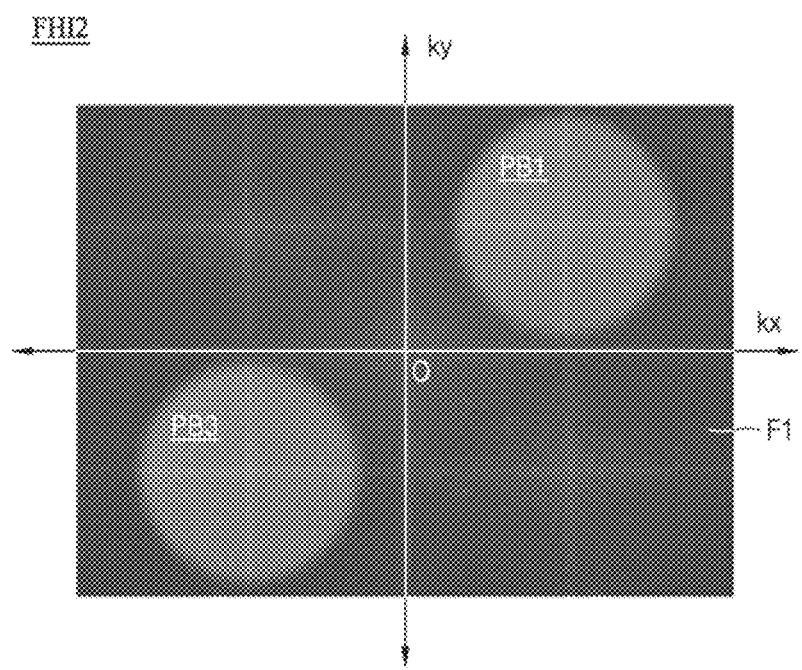
Figure 5C:
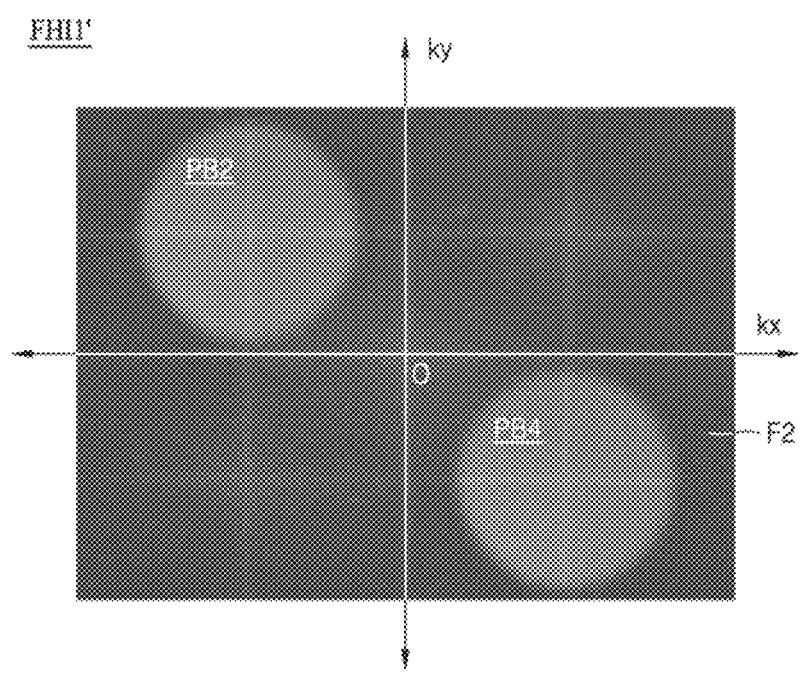

FIGS. 4A through 4C illustrate a first wavenumber domain hologram image HI1, a second wavenumber domain hologram image HI2, and a third wavenumber domain hologram image HI3. FIGS. 5A through 5C illustrate filtered first wavenumber domain hologram images FHI1 and FHI1' and the second wavenumber domain hologram images FHI2 and FHI2'. In FIGS. 4A through 5D, brightness on wave number planes represent magnitudes of corresponding wave number components.

Referring to FIGS. 1 through 3, the holographic microscope 10 may generate the first through third hologram images (P10). The first hologram image may be generated by detecting the object beam OB and the first reference beam RB1 by the pixels of the camera 155 corresponding to the first pixels PX1. The second hologram image may be generated by detecting the object beam OB and the second reference beam RB2 by the pixels of the camera 155 corresponding to the fourth pixels PX4. The third hologram image may be generated by detecting the object beam OB, and the first reference beam RB1 and the second reference beam RB2 by the pixels of the camera 155 corresponding to the second pixels PX2. As a non-limiting example, because the polarization axis of the object beam OB is perpendicular to the polarization axis of the third pixels PX3, a hologram image corresponding to the third pixels PX3 may not be generated.

Next, referring to FIGS. 1, 3, 4A, and 4C, the holographic microscope 10 may generate the first through third wavenumber domain hologram images (HI1, HI2, and HI3) by performing the Fourier transform on the first through third hologram images (P20).

Generally, when each of the object beam OB and the reference beam RB is perpendicularly incident on the camera 155, signals may be distributed around the origin O in the wave number domain. However, the first wave number domain hologram image HI1 may include a first local maximum point MX1 on the first quadrant and a third local maximum point MX3 on the third quadrant, the second wave number domain hologram image HI2 may include a second local maximum point MX2 on the second quadrant and a fourth local maximum point MX4 on the fourth quadrant, and the third wave number domain hologram image HI3 may include the first local maximum point MX1, the second local maximum point MX2, the third local maximum point MX3, and the fourth local maximum point MX3 in the first quadrant, the second quadrant, the third quadrant, and the fourth quadrant, respectively.

In this manner, the local maxima in the wave number domain deviating from the origin O may be formed by the polarized reference beams that are obliquely incident on an object and then interfere with the object beam. For example, the first local maximum point MX1 and the third local maximum point MX3 on the first wave number domain hologram image HI1 may be due to interference between the perpendicularly incident object beam OB and the obliquely incident first reference beam RB1, and the second local maximum point MX2 and the fourth local maximum point MX4 on the second wave number domain hologram image HI2 may be due to interference between the perpendicularly incident object beam OB and the obliquely incident second reference beam RB2. Similarly, the first local maximum point MX1 and the third local maximum point MX3 on the third wave number domain hologram image HI3 may be due to interference between the first reference beam RB1 and the object beam OB, and the second local maximum point MX2 and the fourth maximum point MX4 may be due to interference between the second reference beam RB2 and the object beam OB.

Next, referring to FIGS. 3 and 5A through 5D, the filtered first and second hologram images (FHI1, FIH2, FHI1', and FHI2') in the wave number domain may be generated (P30).

The filtered first hologram image FHI1 and the second hologram image FIH2 in the wave number domain illustrated in FIGS. 5A and 5B may be generated by a first filter F1. The first filter F1 may have a first pass band PB1 centered on the first maximum point MX1 and a third pass band PB3 centered on the third maximum point MX3. As a non-limiting example, the first pass band PB1 and the third pass band PB3 may be circular regions centered on the first maximum point MX1 and the third maximum point MX3, respectively.

Figure 5D:
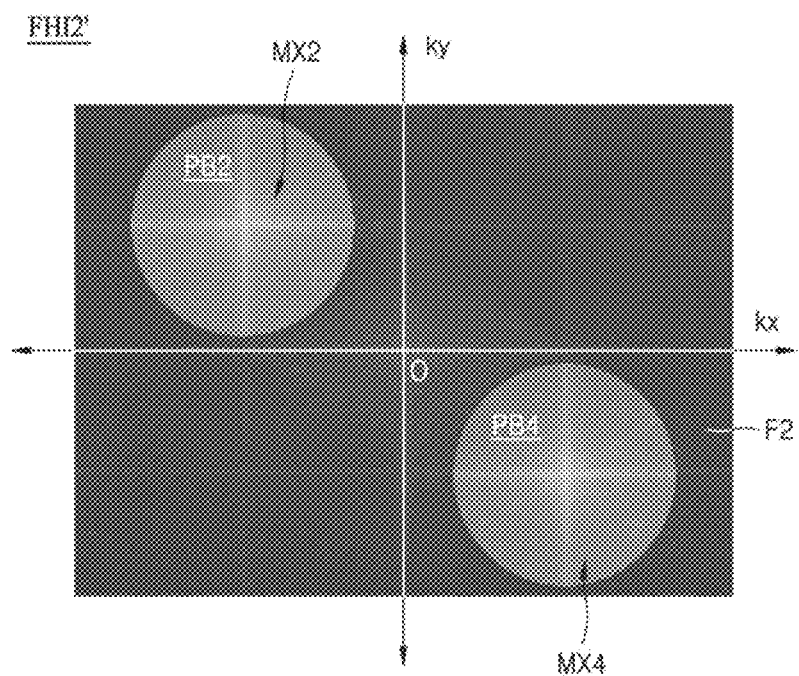

The filtered first hologram image FHI1' and the second hologram image FIH2' in the wave number domain illustrated in FIGS. 5C and 5D may be generated by a second filter F2. The second filter F2 may have a second pass band PB2 centered on the second maximum point MX2 and a fourth pass band PB4 centered on the fourth maximum point MX4. As a non-limiting example, the second pass band PB2 and the fourth pass band PB4 may be circular regions centered on the second maximum point MX2 and the fourth maximum point MX4, respectively.

According to example embodiments, the first pass band PB1, the second pass band PB2, the third pass band PB3, and the fourth pass band PB4 may have various shapes other than a circular shape. For example, the first pass band PB1, the second pass band PB2, the third pass band PB3, and the fourth pass band PB4 may have square regions, but embodiments are not limited thereto. As another example, the first pass band PB1, the second pass band PB2, the third pass band PB3, and the fourth pass band PB4 may have shapes similar to the first local maximum point MX1, the second local maximum point MX2, the third local maximum point MX3, and the fourth local maximum point MX4, respectively. When the first local maximum point MX1, the second local maximum point MX2, the third local maximum point MX3, and the fourth maximum point MX4 are cross-shaped, the first pass band PB1, the second pass band PB2, the third pass band PB3, and the fourth pass band PB4 may also be cross-shaped.

Next, the wave number domain hologram image from which noise has been removed may be generated (P40).

The filtered first wave number domain hologram image FHI1 may include the first local maximum point MX1 and the second local maximum point MX2 in the first pass band PB1 and the second passband PB2, respectively, while the filtered second wave number domain hologram image FHI2 may not include local maximum points in the first pass band PB1 and the second pass band PB2. Thus, the second wave number domain hologram image FHI2 may be regarded as the DC noise for the filtered first wave number domain hologram image FHI1. The processor 160 may generate a first differential image by performing differential operations on the filtered first wave number domain hologram image FHI1 and second wave number domain hologram image FIH2.

Similarly, the processor 160 may generate a second differential image by performing differential operations on the filtered first wave number domain hologram images FHI1' and the second wave number domain hologram image FIH2'. The first and second differential images may be selectively generated, but embodiments are not limited thereto. For example, only the first differential image may be generated, and the second differential image may not be generated. Or, only the second differential image may be generated, and the first differential image may not be generated.

Next, the real domain image may be generated (P50). The generation operation may include parallel movement of any one among pass bands included in any one of the first and second differential images of the real domain image such that a local maximum point of the pass band is located at the origin, and application of inverse Fourier transform on the parallel-moved pass band. Generation of the real domain image may include reconstructing an image of the wafer W by propagating the hologram image back to an imaging plane of the wafer W and fetching the phase image.

According to example embodiments, by causing the reference beams RB of the polarized beams perpendicular to each other to enter at different incident angles, it may be possible to separate the local maximum points of the wave number domain hologram images that are formed at substantially the same time and at the same portion of the wafer W. Accordingly, because components of the DC noise may be removed, SNR may be improved.

Figure 6A:
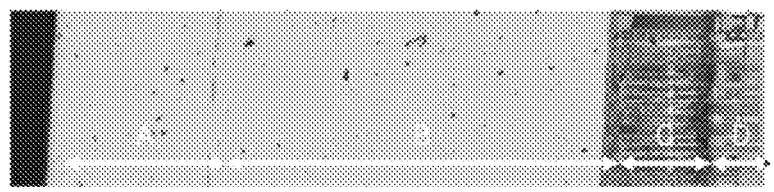
FIGS. 6A, 6B, and 6C are illustrate effects of a holographic microscope, according to an example embodiment.
Figure 6B:
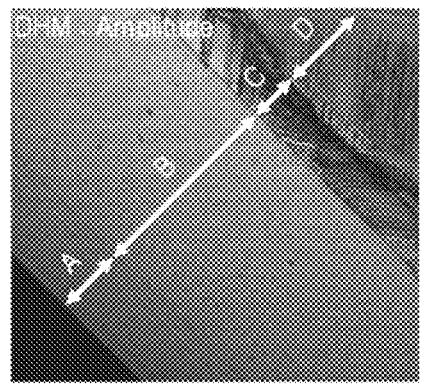
Figure 6C:
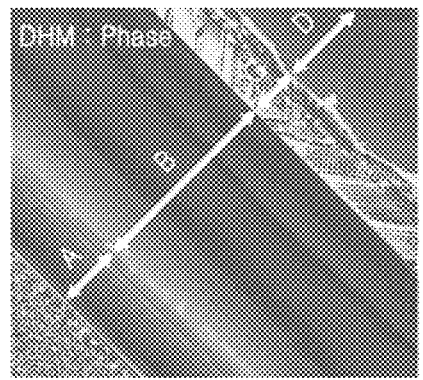

FIGS. 6A, 6B, and 6C illustrate effects of a holographic microscope 10 in FIG. 1 according to example embodiments.

FIG. 6A is an image taken at the edge of the wafer W after an edge bead removal (EBR) process and a laser cleaning process are performed by using a general optical microscope. FIGS. 6B and 6C are images of the same portion in FIG. 6A, and show magnitudes and phase images obtained by using a holographic microscope 10 in FIG. 1 according to example embodiments.

The EBR process may be a process of removing photoresist by spraying a solution on the edge of the wafer W while rotating the wafer W. Accordingly, in a spin coating process, edge beads EB formed by accumulation of the photoresist on the edge and side edges of the wafer W may be removed. The laser cleaning process may be a process of radiating a laser beam to smooth irregular boundaries of the photoresist after the EBR process. A misalignment of the wafer W by edge beads and particle contamination due to separation of photoresist materials may be prevented or reduced by the EBR and laser cleaning processes.

In FIGS. 6A through 6C, portions A, B, and C may be portions in which the photoresist is removed by the EBR process and material layers stacked on the top surface of the wafer W or thereon are exposed. A portion D may be a portion where the photoresist is not removed. Patterns for an actual operation of a semiconductor device may not be formed on portions A, B, and C. The EBR process may be performed on portions A, B, and C, and the laser cleaning process may be performed on portions A and B.

Referring to FIG. 6A, a general optical microscope has an issue that it is difficult to identify an interface surface, between the C portion and the D portion, which is a boundary surface of a portion from which the photoresist has been removed by the EBR process. Referring to FIGS. 6B and 6C, particularly, the boundary between the portion C and the portion D of the phase image may be clearly identified.

Recently, the demand for vertical NAND flash memories has increased due to the high integration of semiconductor devices. As a result, repeated spin coating and EBR processes may be performed on the edge of the wafer W in an overlapping manner, but there is an issue that defining the boundary of the EBR process becomes more difficult as the number of underlying layers increases. Accordingly, it has been confirmed that an occurrence frequency of crack defects on the edge of the wafer W is about 3 times higher than that around the center of the wafer W.

Such cracks may occur when the EBR process and the laser cleaning process are performed in an overlapping manner at a location where the pattern for forming an actual semiconductor element is formed, such as a metal wiring or the like. The cracks may cause metal contamination and particle contamination. According to example embodiments, because the boundary of the EBR process may be clearly identified, the cracks due to the laser cleaning may be prevented or reduced. Accordingly, the reliability of the manufacturing method of the semiconductor device may be enhanced.

Figure 7A:
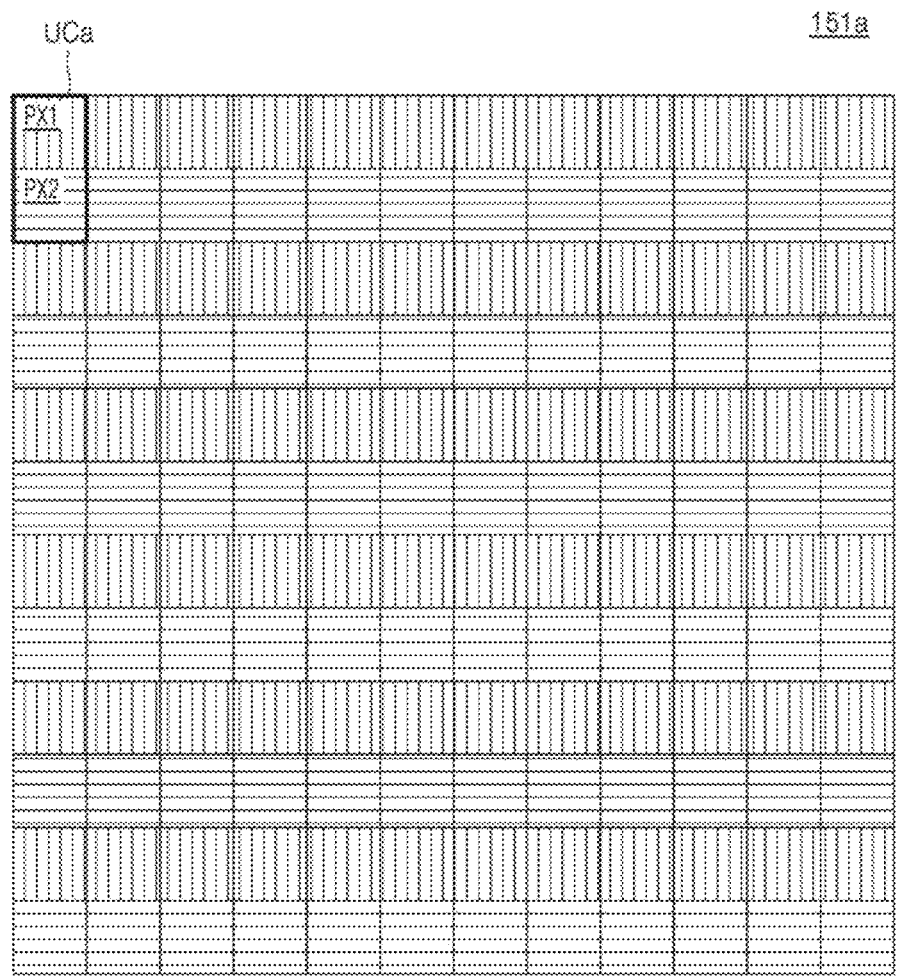
FIGS. 7A, 7B, and 7C illustrate the MPA usable in a holographic microscope according to example embodiments.
Figure 7B:
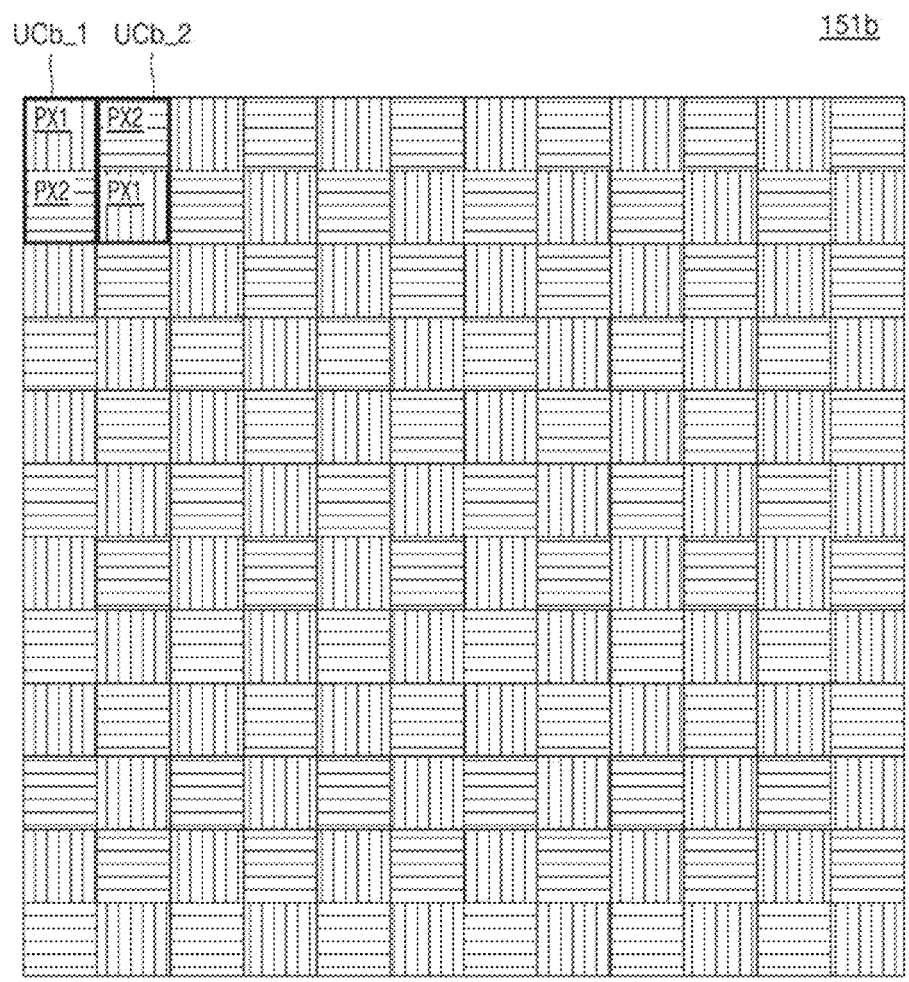
Figure 7C:
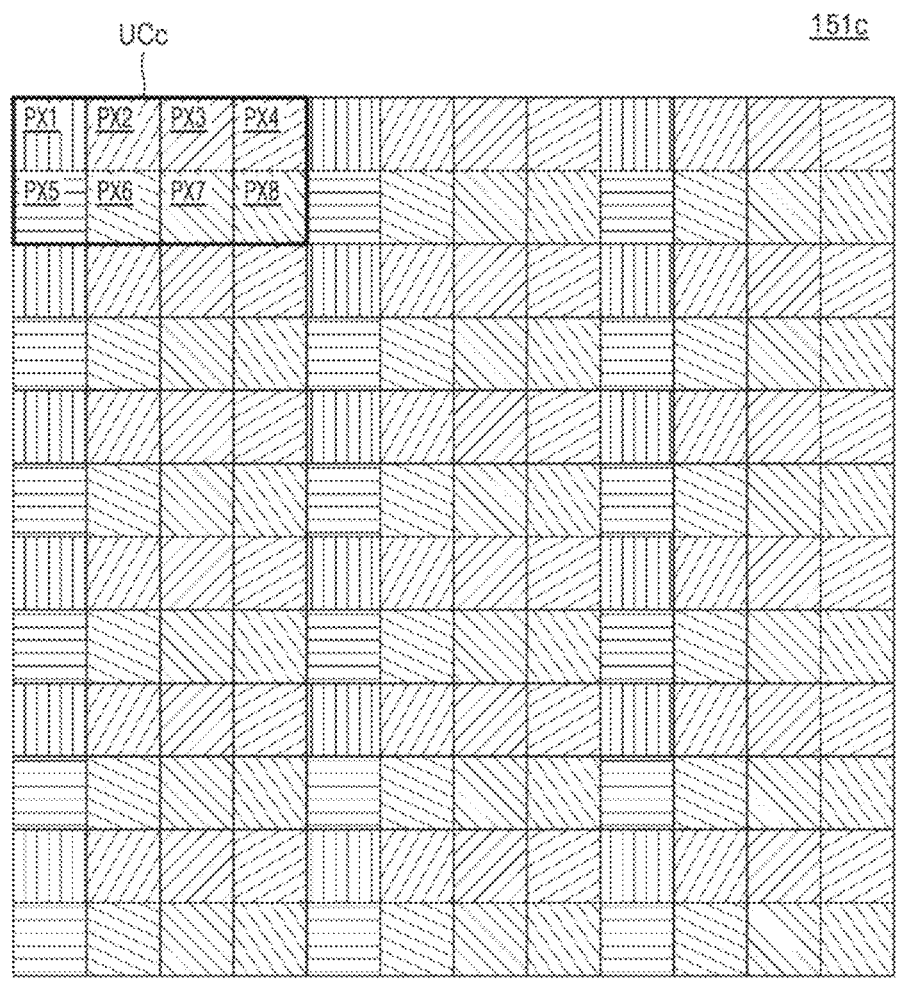

FIGS. 7A, 7B, and 7C illustrate MPAs 151a, 151b, and 151c usable in a holographic microscope according to example embodiments.

For convenience of description, duplicate descriptions given with reference to FIG. 2 are omitted and differences are mainly described.

Referring to FIG. 7A, the MPA 151a may include a plurality of unit cells UCa, and the unit cells UCa may include the first pixel PX1 and a second pixel PX2. The first pixel PX1 and the second pixel PX2 may include polarization axes orthogonal to each other. As a non-limiting example, while transmitting the P-polarized beam, the first pixels PX1 may block the S-polarized beam. While transmitting the S-polarized beam, the second pixels PX2 may block the P-polarized beam. Referring to FIG. 7A, the unit cells UCa adjacent to each other in the drawing may include the first pixel PX1 and the second pixel PX2 that are arranged in the same manner. Accordingly, each of the first pixels PX1 and the second pixels PX2 may be arranged in a row.

According to example embodiments, each of the unit cells UCa may include only two pixels, and accordingly, a hologram image with a higher resolution may be obtained when a camera having the same number of pixels is used. Thus, the reliability of the holographic microscope may be enhanced.

Referring to FIG. 7B, unlike as illustrated in FIG. 7A, unit cells UCb_1 and UCb_2 adjacent to each other may include the first pixel PX1 and the second pixel PX2 that are alternately arranged. Accordingly, the first pixels PX1 may be surrounded by the second pixels PX2, and the second pixels PX2 may be surrounded by the first pixels PX1.

Referring to FIG. 7C, the MPA 151c may include a plurality of unit cells UCc.

Each of the unit cells UCc may include first pixel PX1, a second pixel PX2, a third pixel PX3, a fourth pixel PX4, a fifth pixel PX5, a sixth pixel PX6, a seventh pixel PX7, and an eighth pixel PX8. The polarization axes of the first pixels PX1 may be substantially perpendicular to polarization axes of the fifth pixels PX5. The polarization axis of the second pixels PX2 may be substantially perpendicular to a polarization axis of the sixth pixels PX6. The polarization axis of the third pixels PX3 may be substantially perpendicular to a polarization axis of the seventh pixels PX7. The polarization axis of the fourth pixels PX4 may be substantially perpendicular to a polarization axis of the eighth pixels PX8.

As illustrated in FIG. 2, when the direction of the polarization axis of the first pixels PX1 is set as a reference, for example, at about 0°, the polarization axis of the second pixels PX2 may be directed at about 30°, the polarization axis of the third pixels PX3 may be directed at about 45°, the polarization axis of the fourth pixels PX4 may be directed at about 60°, the polarization axis of the fifth pixels PX5 may be directed at about 90°, the polarization axis of the sixth pixels PX6 may be directed at about 120°, the polarization axis of the seventh pixels PX7 may be directed at about 135°, and the eighth polarization axis of the eight pixels PX8 may be directed at about 150°.

Referring to FIGS. 1 and 7C, the polarization directions of an input beam IB in FIG. 1 and the first reference beam RB1 and the second reference beam RB2 may be selected according to characteristics of a holographic inspection object. For example, when the input beam IB in FIG. 1 is polarized by about 45°, the hologram images may be generated by using the first pixel PX1 and the fifth pixel PX5, when the input beam IB in FIG. 1 is polarized by about 75°, the hologram images may be generated by using the second pixel PX2 and the sixth pixel PX6, when the input beam IB in FIG. 1 is polarized by about 90°, the holographic images may be generated by using the third pixel PX3 and the seventh pixel PX7, and when the input beam IB in FIG. 1 is polarized by about 105°, the hologram images may be generated by using the fourth pixel PX4 and the eighth pixel PX8.

According to example embodiments, the MPA 151c may be used with additional polarizers on paths of the first reference beam RB1 and the second reference beam RB2 in FIG. 1. Accordingly, an inspection using the input beam IB having a polarization axis selected according to the characteristics of the wafer W may be possible.

Figure 8:
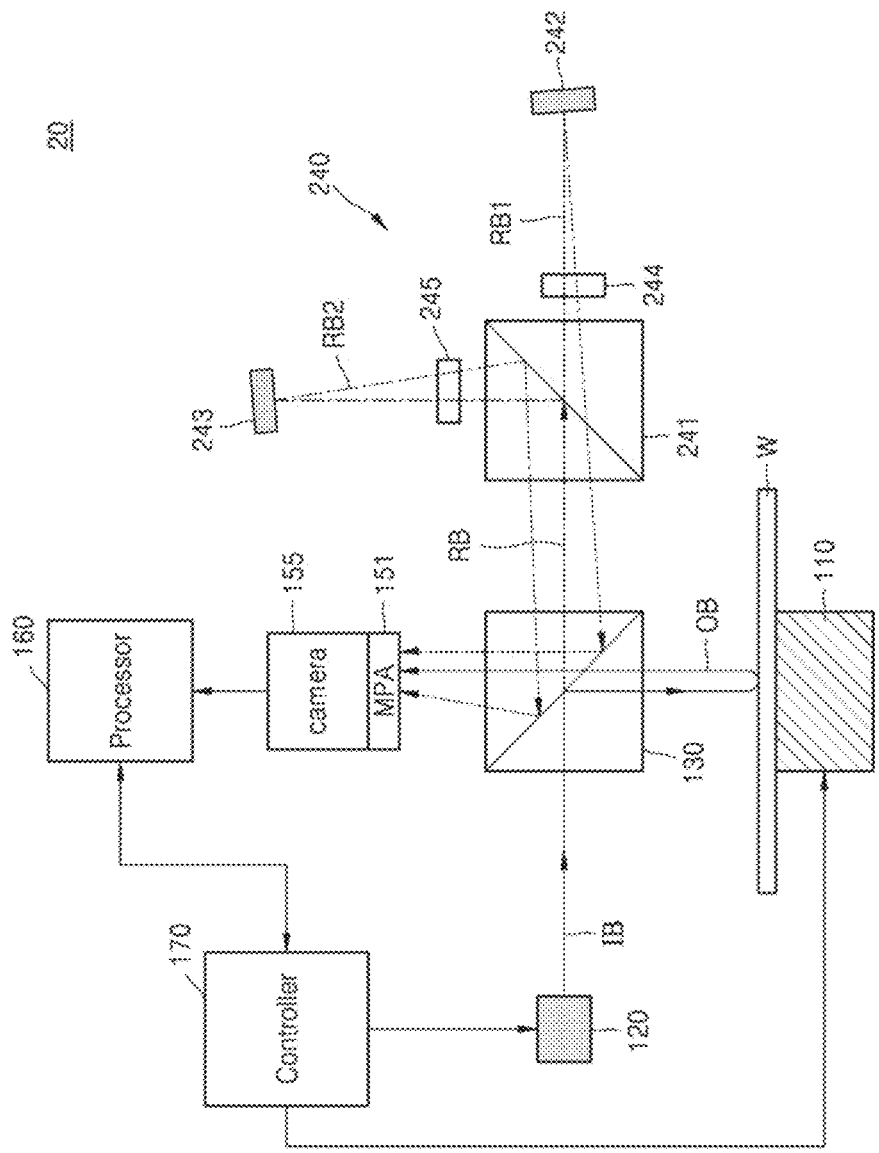
FIGS. 8, 9, and 10 illustrate holographic microscopes according to example embodiments.
Figure 9:
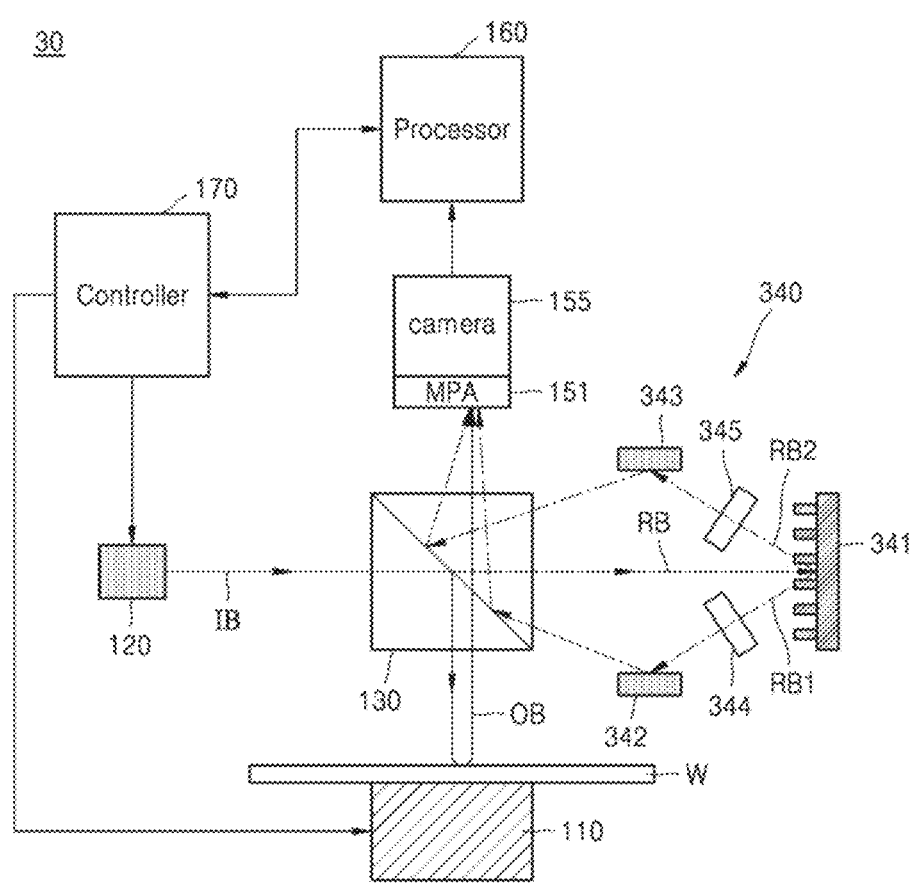
Figure 10:
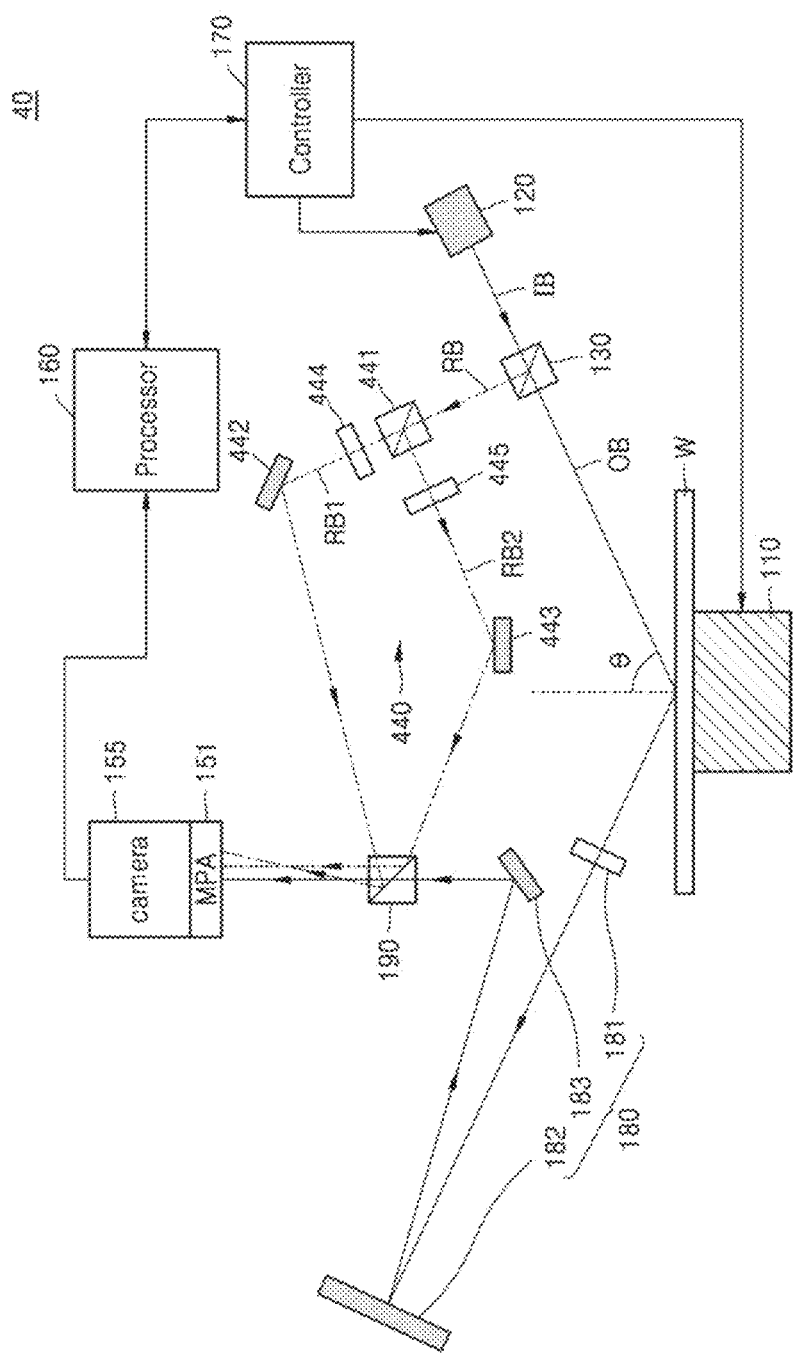

FIGS. 8, 9, and 10 illustrate holographic microscopes 20, 30, and 40 according to example embodiments.

For convenience of description, duplicate descriptions given with reference to FIGS. 1, 2, and 7A through 7C are omitted and differences are mainly described.

Referring to FIG. 8, the holographic microscope 20 may include the stage 110, the input optical system 120, the beam splitter 130, a reference optical system 240, the MPA 151, the camera 155, the processor 160, and the controller 170.

According to example embodiments, the reference optical system 240 may include a beam splitter 241, a first mirror 242 and a second mirrors 243, and a first polarizer 244 and a second polarizer 245.

The beam splitter 241 may transmit a portion of the reference beam RB and reflect the other portion thereof. The beam transmitted through the beam splitter 241 may be the first reference beam RB1. The beam transmitted through the beam splitter 241 may be the second reference beam RB2.

According to example embodiments, the first reference beam RB1 may be P-polarized after passing through the first polarizer 244, and the second reference beam RB2 may be S-polarized after passing through the second polarizer 245, but embodiments are not limited thereto. According to example embodiments, the first polarizer 244 and the second polarizer 245 may be connected to a rotation drive element and rotated to have any axes of polarization. The first reference beam RB1 and the second reference beam RB2 may be polarized at arbitrary axes of polarization orthogonal to each other. The first reference beam RB1 may be reflected by the first mirror 242, again reflected by the beam splitter 130, and then pass through the MPA 151 to enter the camera 155. The second reference beam RB2 may be reflected by the second mirror 243, again reflected by the beam splitter 130, and then pass through the MPA 151 to enter the camera 155.

Referring to FIG. 9, the holographic microscope 30 may include the stage 110, the input optical system 120, the beam splitter 130, a reference optical system 340, the MPA 151, the camera 155, the processor 160, and the controller 170.

According to example embodiments, the reference optical system 340 may include a reflective grating 341, a first mirror 342 and a second mirror 343, and a first polarizer and a second polarizer 345.

The reflective grating 341 may have a structure in which gratings having different refractive indices from each other and extending in one direction are alternately and periodically arranged. Each of the light beams incident on different patterns of the gratings of the reflective grating 341 may be a new wave source. Local maximum points due to constructive interference between waves transmitted from the respective wave sources, for example, respective patterns of the gratings, and local minimum points due to offset interference therebetween may be formed. Accordingly, the reference beam RB may be separated into the first reference beam RB1 and the second reference beam RB2 by the reflective grating 341.

Intensity characteristics of the first reference beam RB1 and the second reference beam RB2 may depend on the spacing between the gratings included in the reflective grating 341, shapes of the gratings, and wavelengths of a light source used. As a non-limiting example, the first reference beam RB1 and the second reference beam RB2 may be a first order reflected diffraction light beam and a negative first order reflected diffraction light beam, respectively. According to example embodiments, the reflective grating 341 may include the gratings formed in a manner that a zeroth order diffraction light beam is eliminated.

According to example embodiments, the first reference beam RB1 may be P-polarized after passing through the first polarizer 344, and the second reference beam RB2 may be S-polarized after passing through the second polarizer 345, but the embodiment is not limited thereto. According to example embodiments, the first polarizer 344 and the second polarizer 345 may be connected to a rotation drive element and rotated to have any axes of polarization. The first reference beam RB1 and the second reference beam RB2 may be polarized so that axes of polarization are orthogonal to each other.

The first reference beam RB1 may be reflected by the first mirror 342, again reflected by the beam splitter 130, and then pass through the MPA 151 to enter the camera 155. The second reference beam RB2 may be reflected by the second mirror 343, again reflected by the beam splitter 130, and then pass through the MPA 151 to enter the camera 155.

Referring to FIG. 10, the holographic microscope 40 may include the stage 110, the input optical system 120, the beam splitter 130, a reference optical system 440, the MPA 151, the camera 155, the processor 160, the controller 170, an object optical system 180, and a beam splitter 190.

The holographic microscope 40 of FIG. 10 may be implemented with an inclined optical system, unlike the holographic microscopes 10, 20, and 30 of FIGS. 1, 8, and 9, respectively. The incident beam IB may be separated into the object beam OB and the reference beam RB by the beam splitter 130. The object beam OB may be obliquely incident on the top surface of the wafer W. When an angle θ between the normal line to the top surface of the wafer W and the object beam OB is sufficiently large, because the object beam OB having an identical cross-section is capable of inspecting a wider area of the wafer W, an inspection speed may be increased.

The angle θ may be a Brewster angle, for example, about 65°, but embodiments are not limited thereto. When the angle θ is equal to the Brewster angle, polarization control of the object beam OB reflected by the top surface of the wafer W may be much easier.

The object optical system 180 may include a polarizer 181 and mirrors 182 and 183. The polarizer 181 may change the polarization axis of the object beam OB reflected by the wafer W. According to example embodiments, the polarizer 181 may be connected to a rotational drive element and may be rotated to have any axis of polarization. The polarizer 181 may be omitted in some cases. The minors 182 and 183 may be any one of a planar mirror, a spherical minor, and an aspherical minor. The mirrors 182 and 183 may have any configuration such that the object beam OB is incident substantially perpendicular to the MPA 151 and the camera 155.

The reference optical system 440 may include a beam splitter 441, a first mirror 442 and a second mirror 443, and a first polarizer 444 and a second polarizer 445, and may perform a similar optical function to that of the reference optical system 240 illustrated in FIG. 8. Accordingly, the first reference beam RB1 and the second reference beam RB2 may be polarized to have polarization axes perpendicular to each other and may be obliquely incident on the camera 155 at different angles from each other.

Figure 11:
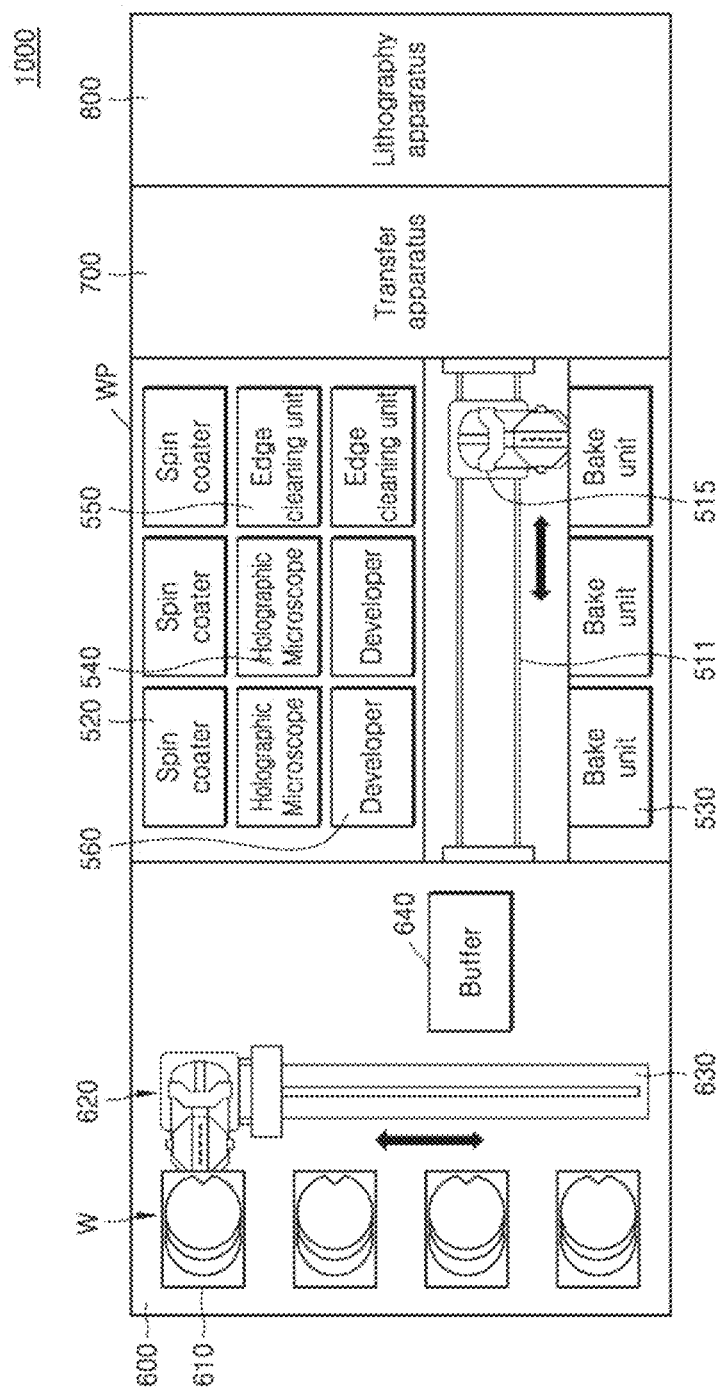
FIG. 11 is a block diagram describing a manufacturing method of a semiconductor device according to an example.

FIG. 11 is a block diagram of semiconductor device manufacturing equipment 1000 according to example embodiments.

Referring to FIG. 11, the semiconductor device manufacturing equipment 1000 may include, for example, spinner equipment. The semiconductor device manufacturing equipment 1000 may include a wafer loader 600, a wafer processing apparatus WP, a transfer apparatus 700, and a lithography apparatus 800. The semiconductor device manufacturing equipment 1000 may further include a monitoring control system for controlling each component included in the semiconductor device manufacturing equipment 1000 and the overall processes, and monitoring results of the processes. The semiconductor device manufacturing equipment 1000 may perform forming photoresist on wafers W, exposing the photoresist, and developing the exposed photoresist.

The wafer loader 600 may include a plurality of load ports 610, an index robot 620, a transfer rail 630, and a buffer 640. The plurality of load ports 610 may accommodate the wafers W. The index robot 620 may move along the transfer rail 630. The index robot 620 may transfer the wafers W accommodated in the load ports 610 to the buffer 640.

The wafer processing apparatus WP may include a plurality of apparatuses that perform a series of processes on the wafers W. The wafer processing apparatus WP may include a transfer rail 511, a transfer robot 515, a plurality of spin coaters 520, a plurality of bake units 530, a plurality of holographic microscopes 540, and a plurality of edge cleaning units 550, and a plurality of developers 560.

For convenience of illustration, a plurality of components included in the wafer processing apparatus WP are illustrated as being horizontally apart from each other, but the same components may constitute a stacked structure, for example, the plurality of bake units 530 are stacked on each other, or different components may constitute a stacked structure, for example, the edge cleaning units 550 and/or the developers 560 are stacked on the spin coaters 520.

The transfer robot 515 may move along the transfer rail 511 and may transfer the wafers W from the buffer 640 to at least any one of the plurality of spin coaters 520, the plurality of holographic microscopes 540, and the plurality of developers 560, and the plurality of bake units 530. The transfer robot 515 may transfer the wafers W between the plurality of spin coaters 520, the plurality of holographic microscopes 540, the plurality of developers 560, and the plurality of bake units 530. The transfer robot 515 may transfer the wafers W on which a series of processes for exposure have been performed to the transfer apparatus 700.

The plurality of spin coaters 520 may perform a process of coating the photoresist on the wafers W. The plurality of spin coaters 520 may further perform the EBR process on the photoresist, but embodiments are not limited thereto. For example, the spin coating process and the EBR process may be performed by different apparatuses from each other. In addition to the photoresist formed during the spin coating process, an organic planarization layer, an anti-reflection coating layer, and a top coating layer may be further formed on the photoresist.

The plurality of holographic microscopes 540 may inspect the photoresist formed on the wafers W. The plurality of holographic microscopes 540 may include any one of the holographic microscopes 10, 20, 30, and 40 described with reference to FIGS. 1 and 8 through 10. The plurality of holographic microscopes 540 may determine a boundary between the wafer W and the photoresist when viewed from above after the EBR process is performed, and determine the boundary of the overall front surface of the wafer W by using a method such as fitting. The plurality of holographic microscopes 540 may further perform defect inspection across the entire photoresist.

Each of the plurality of edge cleaning units 550 may include a laser cleaning unit. The plurality of edge cleaning units 550 may trim the circumference of the photoresist based on the inspection results of the holographic microscopes 540. Because the EBR process is a process in which a solution is sprayed onto the rotating wafer W, the controllability may be somewhat insufficient. Accordingly, the photoresist on which the EBR process has been performed may have an irregular boundary profile, or remnants of the photoresist may remain on the wafer W.

The plurality of edge cleaning units 550 may radiate a laser beam onto the edge portion of the wafer W. Accordingly, portions in which the photoresist is unevenly removed and the photoresist that unintentionally remains may be removed.

In FIG. 11, the edge cleaning units 550 are described as being provided as separate components, but embodiments are not limited thereto. The edge cleaning units 550 may be included in the holographic microscopes 540, or may be included in the bake units 530.

The plurality of developers 560 may perform a developing process on a substrate on which an exposure process is completed. The developing process may be a process of removing exposed or unexposed portions of the photoresist. The developing process may include spraying developer onto the wafer W and then spinning the wafer W to coat the developer evenly over the entire surface of the wafer W, or immersing the wafer W in the developer for a certain time. The exposed portion or the unexposed portion of the photoresist may be removed by the developing process. After the developing process, a washing process using de-ionized water or the like may be further performed to remove contaminated particles.

The plurality of bake units 530 may perform a bake process of heat treating the substrate. The plurality of bake units 530 may each include a bake plate and a chill plate. The bake plate may heat the wafers W to a certain temperature and for a certain time, and the chill plate may cool the wafers W heated in the bake plate down to an appropriate temperature. The bake units 530 may perform soft bake, post exposure bake (PEB), and hard bake.

The transfer apparatus 700 may include a buffer in which the wafers W are stored before and after performing of the exposure by the lithography apparatus 800. The transfer apparatus 700 may transfer the wafers W, on which the series of processes for the exposure, for example, spin coating, EBR, laser cleaning, and soft bake, have been performed, to the lithography apparatus 800, and may transfer the wafers W on which the exposure has been completed to the wafer processing apparatus WP.

The lithography apparatus 800 may perform an extreme ultraviolet (UV) (EUV) lithography process. The lithography apparatus 800 may include a lithography apparatus of a dual stage type including two wafer tables for measurement and exposure. The lithography apparatus 800 may include a lithographic apparatus control unit, a measuring station, and an exposure station.

The lithography apparatus control unit may include a signal and data processing capacity for performing a desired operation related to the operation of the lithography apparatus 800.

The measurement station may perform measurements of the wafers W before the exposure is performed. The measurement station may map a surface height of the wafers W, and measure a position of an alignment mark on the wafers W. The alignment mark may have, for example, a box in box structure or a diffraction grating structure.

The exposure station may include a projection system. The projection system may include a system for conditioning and focusing light for the exposure. In the exposure station, a table in which the exposure mask such as an EUV/deep UV (DUV) mask is mounted may be arranged. The EUV/DUV beam may be focused on the exposure mask by the projection system. The exposure mask may be of either a transmission type or a reflection type, and patterning light on the exposure mask may reach the wafer W on which the photoresist layer is provided. Accordingly, the pattern formed in the exposure mask may be transferred to the photoresist formed on the wafer W.

The wafers W reaching the lithography apparatus 800 may be newly prepared wafers W or wafers W that have been previously processed in the lithography apparatus 800 or another apparatus. The wafers W unloaded from the lithography apparatus 800 may be reloaded for further exposure in the lithography apparatus 800, may be patterned by the developer 560 or the like, or may be finished by a dicing and packaging process or the like.

Figure 12:
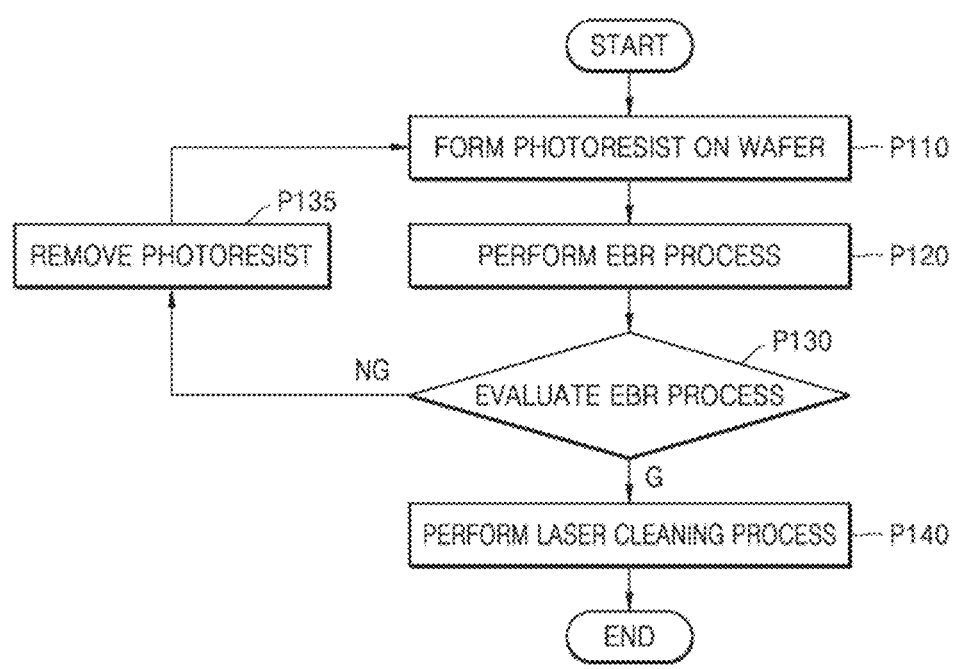
FIG. 12 is a flowchart of a manufacturing method of a semiconductor device, according to an example.

FIG. 12 is a flowchart of a manufacturing method of a semiconductor device, according to example embodiments.

The manufacturing method of the semiconductor device shown in FIG. 12 may include, for example, a lithography process.

Referring to FIGS. 11 and 12, the photoresist may be formed on the wafer W (P110). The photoresist may be formed by the spin coaters 520, and the wafer W may be further rotated for a certain time to dry the wafer W after the photoresist is formed.

Next, the EBR process may be performed (P120). While the EBR process is performed, the spin coaters 520 may include a solution dispenser which sprays solution to the edge portion of the wafer W, and the edge beads thereof may be removed by the solution. While the solution SOL is being provided, the spin coaters 520 may rotate the wafer W, and after the injection of the solution SOL is completed, the wafer W may be further rotated for a certain time to dry the wafer W.

Next, an evaluation of the EBR process may be performed (P130). The evaluation of the EBR process may be performed by the holographic microscopes 540, and may be substantially the same as the inspection method described with reference to FIG. 3. The evaluation of the EBR process may include an inspection of the edge portion of the photoresist. The inspection of the edge portion of the photoresist may include measurement of a removal width of the photoresist which is the width of the top surface of the exposed wafer W according to the EBR process.

When the EBR process is evaluated as good (G) in operation P130, the laser cleaning process may be performed (P140). The laser cleaning process may be performed by the edge cleaning units 550 and may depend on the removal width of the photoresist that is identified in the evaluation of the EBR process.

When the EBR process in operation P130 is evaluated as no good (NG), for example, when the photoresist is too little removed or excessively removed, the photoresist layer may be provided again in operation P110 after the photoresist is removed in operation P135.

While example embodiments have been particularly shown and described above, it will be understood that various changes in form and details may be made therein without departing from the spirit and scope of the following claims.

What is claimed is:

1. A manufacturing method of a semiconductor device, the manufacturing method comprising:
generating a first hologram image by interfering a first reference beam that is linearly polarized with an object beam that is reflected by a top surface of a wafer, and generating a second hologram image by interfering a second reference beam having a polarization direction substantially perpendicular to the first reference beam with the object beam;
generating the first hologram image in a wave number domain and the second hologram image in the wave number domain by applying Fourier transform to a first image and a second image, respectively; and
generating a differential image in the wave number domain based on the first hologram image in the wave number domain and the second hologram image in the wave number domain,
wherein the first hologram image and the second hologram image are generated by a camera, and
wherein the first reference beam and the second reference beam are obliquely incident on the camera, and the object beam is perpendicularly incident on the camera.

2. The manufacturing method of claim 1, wherein a first polarization direction of the first reference beam is substantially perpendicular to a second polarization direction of the second reference beam.

3. The manufacturing method of claim 1, wherein a magnitude of a polarization component of the object beam parallel with a first polarization direction of the first reference beam is identical to a magnitude of a polarization component of the object beam parallel with a second polarization direction of the second reference beam.

4. The manufacturing method of claim 1, further comprising applying a filter comprising first pass bands centered at first local maximum points of the first hologram image in the wave number domain to the first hologram image and the second hologram image.

5. The manufacturing method of claim 4, further comprising generating a differential image of a first pass band of the first hologram image in a first wave number domain and the first pass band of the second hologram image in a second wave number domain.

6. The manufacturing method of claim 5, further comprising applying a parallel movement to the first pass band such that a local maximum included in the first pass band is located at an origin, with respect to the first pass band that is any one of pass bands of the differential image of the first pass band.

7. The manufacturing method of claim 6, further comprising generating a real domain image by applying inverse Fourier transform to the first pass band to which the parallel movement has been applied.

8. A manufacturing method of a semiconductor device, the manufacturing method comprising:
   coating a photoresist layer on a wafer;
   removing a portion of the photoresist layer coated on a boundary of the wafer based on an edge bead removal operation; and
   evaluating the edge bead removal operation,
   wherein the evaluating the edge bead removal operation comprises:
      generating a first hologram image by interfering a first reference beam that is linearly polarized with an object beam that is reflected by an edge portion of the wafer, and generating a second hologram image by interfering a second reference beam having a polarization direction perpendicular to the first reference beam with the object beam;
      generating the first hologram image in a wave number domain and the second hologram image in the wave number domain by applying Fourier transform to a first image and a second image, respectively; and
      generating a differential image in the wave number domain based on the first hologram image in the wave number domain and the second hologram image in the wave number domain,
   wherein the first hologram image and the second hologram image are generated by a camera, and
   wherein the first reference beam and the second reference beam are inclined at angles that are different from each other with respect to the camera, and the object beam is perpendicularly incident on the camera.

9. The manufacturing method of claim 8, wherein a first polarization direction of the first reference beam is substantially perpendicular to a second polarization direction of the second reference beam.

10. The manufacturing method of claim 8, wherein a magnitude of a polarization component of the object beam parallel with a first polarization direction of the first reference beam is identical to a magnitude of a polarization component of the object beam parallel with a second polarization direction of the second reference beam.

11. The manufacturing method of claim 8, further comprising applying a filter comprising first pass bands centered at first local maximum points of the first hologram image in the wave number domain to the first hologram image and the second hologram image.

12. The manufacturing method of claim 11, further comprising generating a differential image of a first pass band of the first hologram image in a first wave number domain and the first pass band of the second hologram image in a second wave number domain.

13. The manufacturing method of claim 12, further comprising applying a parallel movement to the first pass band such that a local maximum included in the first pass band is located at an origin, with respect to the first pass band that is any one of pass bands of the differential image of the first pass band.

14. The manufacturing method of claim 13, further comprising generating a real domain image by applying inverse Fourier transform to the first pass band to which the parallel movement has been applied.

15. The manufacturing method of claim 8, further comprising performing laser cleaning on the photoresist layer based on the evaluation of the edge bead removal operation.

16. A manufacturing method of a semiconductor device, the manufacturing method comprising:
   coating a photoresist layer on a wafer;
   removing a portion of the photoresist layer coated on a boundary of the wafer based on an edge bead removal operation;
   evaluating the edge bead removal operation; and
   performing laser cleaning on the photoresist layer based on the evaluation of edge bead removal operation,
   wherein the evaluating the edge bead removal operation comprises:
      generating a first hologram image by interfering a first reference beam that is linearly polarized with an object beam that is reflected by an edge portion of the wafer, and generating a second hologram image by interfering a second reference beam having a polarization direction perpendicular to the first reference beam with the object beam;
      generating the first hologram image in a wave number domain and the second hologram image in the wave number domain by applying Fourier transform to a first image and a second image, respectively; and
      generating a differential image in the wave number domain based on the first hologram image in the wave number domain and the second hologram image in the wave number domain,
   wherein the first hologram image and the second hologram image are generated by a camera, and
   wherein a first polarization direction of the first reference beam is substantially perpendicular to a second polarization direction of the second reference beam.

17. The manufacturing method of claim 16, wherein a magnitude of a polarization component of the object beam parallel with a first polarization direction of the first reference beam is identical to a magnitude of a polarization component of the object beam parallel with a second polarization direction of the second reference beam.

18. The manufacturing method of claim 16, wherein the first reference beam and the second reference beam are inclined at angles that are different from each other with respect to the camera.

19. The manufacturing method of claim 16, wherein the object beam is perpendicularly incident on the camera.

20. The manufacturing method of claim 16, further comprising applying a filter comprising first pass bands centered at first local maximum points of the first hologram image in the wave number domain to the first hologram image and the second hologram image.

* * * * *